United States Patent
Harrison et al.

(10) Patent No.: US 7,082,678 B2
(45) Date of Patent: Aug. 1, 2006

(54) METHOD OF FABRICATING AN INTEGRATED CIRCUIT PACKAGE

(75) Inventors: Ronnie M. Harrison, Boise, ID (US); David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 10/072,743

(22) Filed: Feb. 7, 2002

(65) Prior Publication Data

US 2002/0132390 A1  Sep. 19, 2002

Related U.S. Application Data

(63) Continuation of application No. 09/004,214, filed on Jan. 9, 1998, now Pat. No. 6,362,426.

(51) Int. Cl.
*H01R 43/00* (2006.01)

(52) U.S. Cl. .............................. 29/827; 29/832; 29/841; 29/850; 29/855; 257/666; 257/668; 257/692

(58) Field of Classification Search .................. 29/827, 29/832, 838–841, 850, 855; 361/772–774; 174/52.4; 257/E21.502, 666–672, 776; 438/15, 438/64, 118
See application file for complete search history.

(56) References Cited

U.S. PATENT DOCUMENTS

| | | | |
|---|---|---|---|
| 3,484,534 A * | 12/1969 | Kilby et al. ............... | 174/52.2 |
| 3,908,075 A | 9/1975 | Jackson et al. | |
| 4,062,107 A | 12/1977 | Blackman et al. | |
| 4,118,858 A | 10/1978 | Taylor et al. | |
| 4,298,769 A * | 11/1981 | Richman ................... | 174/52.4 |
| 4,514,750 A * | 4/1985 | Adams ...................... | 174/52.4 |
| 4,743,956 A | 5/1988 | Olla et al. .................. | 257/668 |
| 4,806,409 A | 2/1989 | Walter et al. | |
| 4,807,018 A * | 2/1989 | Cellai ......................... | 257/675 |
| 4,974,053 A | 11/1990 | Kinoshita et al. .......... | 857/666 |
| 5,036,380 A * | 7/1991 | Chase ........................ | 257/668 |
| 5,115,298 A | 5/1992 | Loh ............................ | 257/691 |
| 5,138,430 A | 8/1992 | Gow, III et al. ............ | 257/712 |
| 5,200,362 A * | 4/1993 | Lin et al. ...................... | 29/841 |
| 5,200,364 A | 4/1993 | Loh ............................... | 29/827 |
| 5,313,102 A | 5/1994 | Lim et al. ................... | 257/787 |
| 5,397,916 A | 3/1995 | Normington ............... | 257/686 |
| 5,457,340 A | 10/1995 | Templeton, Jr. et al. .... | 257/666 |
| 5,569,956 A | 10/1996 | Chillara et al. ............ | 257/674 |
| 5,659,950 A | 8/1997 | Adams et al. | |
| 5,773,878 A | 6/1998 | Lim et al. | |
| 6,362,426 B1 | 3/2002 | Harrison et al. | |

* cited by examiner

*Primary Examiner*—Minh Trinh
*Assistant Examiner*—Donghai D. Nguyen
(74) *Attorney, Agent, or Firm*—TraskBritt

(57) ABSTRACT

A method of forming a semiconductor package is provided. The method includes forming a leadframe wherein the conductors or leads of the leadframe extend from a first end to a second end such that a portion of each lead exhibits a generally arcuate shape. The first end may be coupled with a printed circuit board and the second end may be coupled with a semiconductor die. The generally arcuately shaped portion of the leads may include a portion which exhibits a constant radius. The generally arcuately shaped portion may also be formed from a plurality of conductor segments including, for example, at least one generally arcuately shaped segment. The semiconductor die and at least a portion of the leads may be encapsulated with an insulating material.

13 Claims, 5 Drawing Sheets

METHOD OF FABRICATING AN INTEGRATED CIRCUIT PACKAGE

CROSS-REFERENCE TO RELATED APPLICATION

This application is a continuation of application Ser. No. 09/004,214, filed Jan. 9, 1998, now U.S. Pat. No. 6,362,426 issued Mar. 26, 2002.

BACKGROUND OF THE INVENTION

Field of the Invention

The present invention relates generally to integrated circuit semiconductor chips. More particularly, the present invention pertains to leadframes for bonding with the integrated circuits.

Integrated circuit manufacturers face many design challenges, including reducing the amount of noise in the integrated circuit. Resistance, capacitance and inductance, parasitics of an integrated circuit package, can result in increased signal delays and signal distortions in the electrical signals transmitted to and from the integrated circuit.

Two sources of noise in an integrated circuit package are switching noise and cross-coupling noise, or cross-talk. Switching noise may be an inductive voltage spike that occurs on a conductive path as the result of rapid current switching in the conductive path. Cross-talk is the undesirable appearance of an electrical current in a conductive path as a result of mutual capacitance and inductance between the conductive path and other nearby conductive paths. At higher frequencies, the integrated circuit is even more susceptible to noise.

One approach to reduce noise in an integrated circuit is to increase spacing between transmission lines, such as leads of a leadframe 100 as shown in FIG. 1. The individual leads 110 forming a right angle are curved in a small portion of the lead and have tightly radiused corners 118. However, as integrated circuits and electronic equipment become smaller and more complex, spacing transmission lines farther apart becomes increasingly difficult, if not impossible.

Another approach to reduce noise is to reduce the length of the transmission line on a leadframe by using diagonal leads. While diagonal leads minimize the length of the leads, the spacing between the leads would also be decreased. The decreased spacing would increase the overall cross-talk between the leads, and would therefore be undesirable.

Accordingly, there is a need for an integrated circuit package in which the above benefits are achieved and the above problems are overcome.

BRIEF SUMMARY OF THE INVENTION

The present invention solves the above-mentioned needs in the art and other needs which will be understood by those skilled in the art upon reading and understanding the present specification.

A leadframe is provided comprising, in part, a first and second set of conductors. The leadframe is adapted for coupling with a semiconductor integrated circuit. The conductors of the leadframe extend radially from a first end to a second end such that a portion of each conductor has a generally arcuate shape between the first and second end. In one embodiment, the first end of the conductor is for coupling with a printed circuit board, and the second end is for coupling with a semiconductor die. Alternatively, each conductor is sized and spaced such that the line spacing remains constant.

In another embodiment, the conductors have a plurality of segments. Each conductor has at least three segments disposed between the first end and the second end. The segments forming the conductors are disposed such that a portion of each conductor generally has an arcuate shape. In another embodiment, the segments each have substantially the same length. Alternatively, the segments have varying lengths.

In one embodiment, an integrated circuit package is provided comprising a leadframe having a plurality of leads, at least one semiconductor die coupled with the plurality of leads, and an insulating enclosure encapsulating the die and a portion of the leadframe. The leads each extend radially from a first end to a second end such that a portion of each lead has a generally arcuate shape. Alternatively, in another embodiment, the leads each have at least three segments disposed between the first end and the second end.

DETAILED DESCRIPTION OF THE INVENTION

In the following detailed description, reference is made to the accompanying drawings which form a part hereof, and in which is shown, by way of illustration, specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

Figure 2:
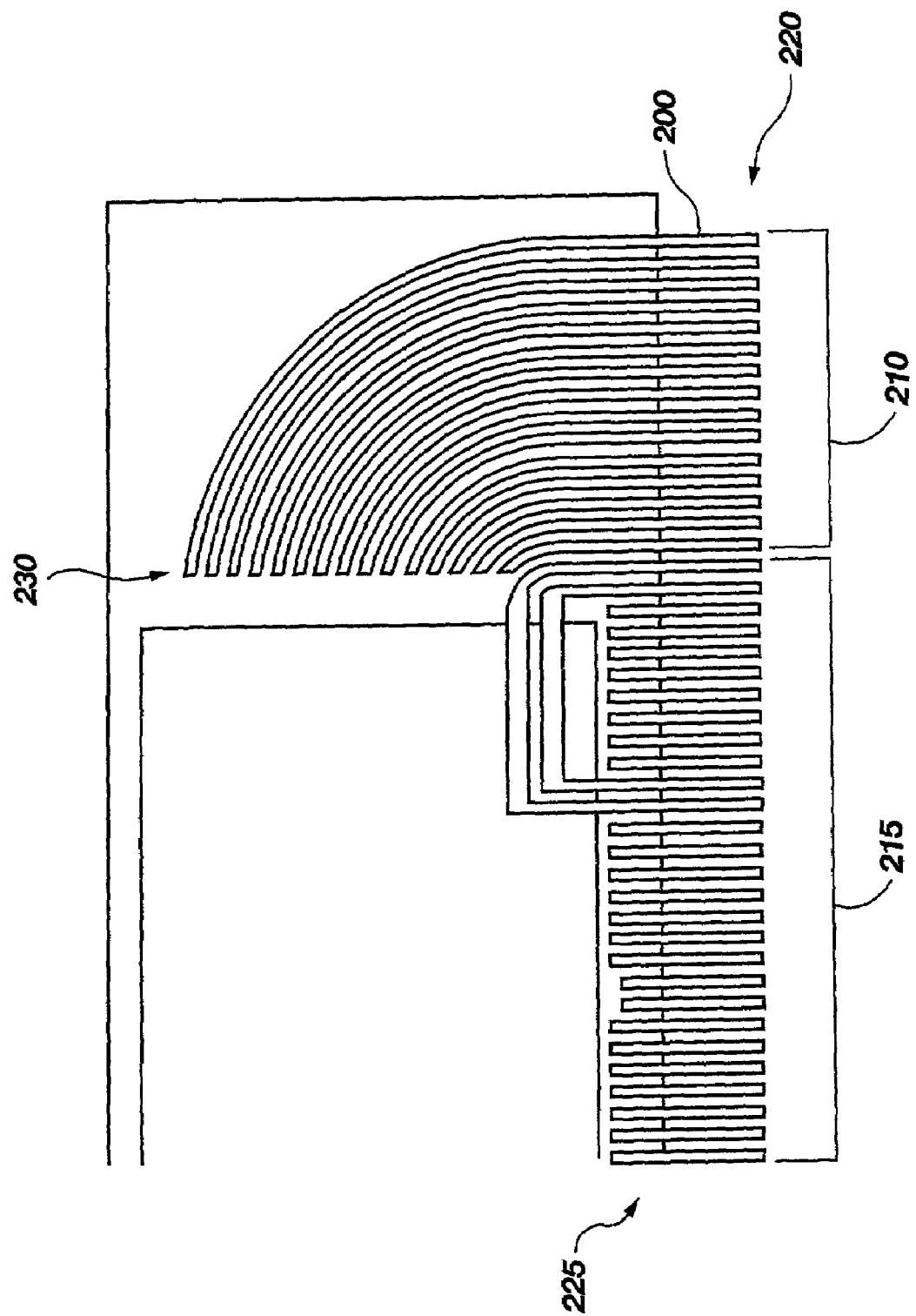
FIG. 2 is a top plan view illustrating a leadframe constructed in accordance with one embodiment of the present invention.

A portion of a leadframe 200 is illustrated in FIG. 2. The leadframe 200 has first and second sets of leads 210, 215. Although leads are discussed, other conductors can be used, such as lead fingers, and are considered within the scope of the invention. The first set of leads 210 extends from a first end 220 to a second end 230, and the second set of leads 215 extends from the first end 220 to a third end 225. For the first set of leads 210, the first end 220 is substantially perpendicular to the second end 230. For the first and second set of leads 210, 215, the first end 220 is for electrically coupling with an electronic system, such as a printed circuit board. The first end 220 can be coupled using reflow solder and other methods as known by those skilled in the art. The second end 230 of the first set of leads 210 and the third end 225 of the second set of leads 215 are adapted for coupling with a semiconductor die, as will be discussed further below.

In one embodiment, a portion of each lead of the first set of leads 210 has a generally arcuate shape, as the lead 210 extends radially from the first end 220 to the second end 230. For some of the first set of leads 210, a substantial portion of the lead has a generally arcuate shape. The arcuate shape of each lead of the first set of leads 210 has a different arc length than the other leads of the first set of leads 210. In another embodiment, each lead of the first set of leads 210 is spaced and sized such that the line spacing between at least one lead, or alternatively each lead, remains constant from the first end 220 to the second end 230. Each lead of the second set of leads 215 extends substantially straight from the first end 220 to the third end 225.

Figure 3:
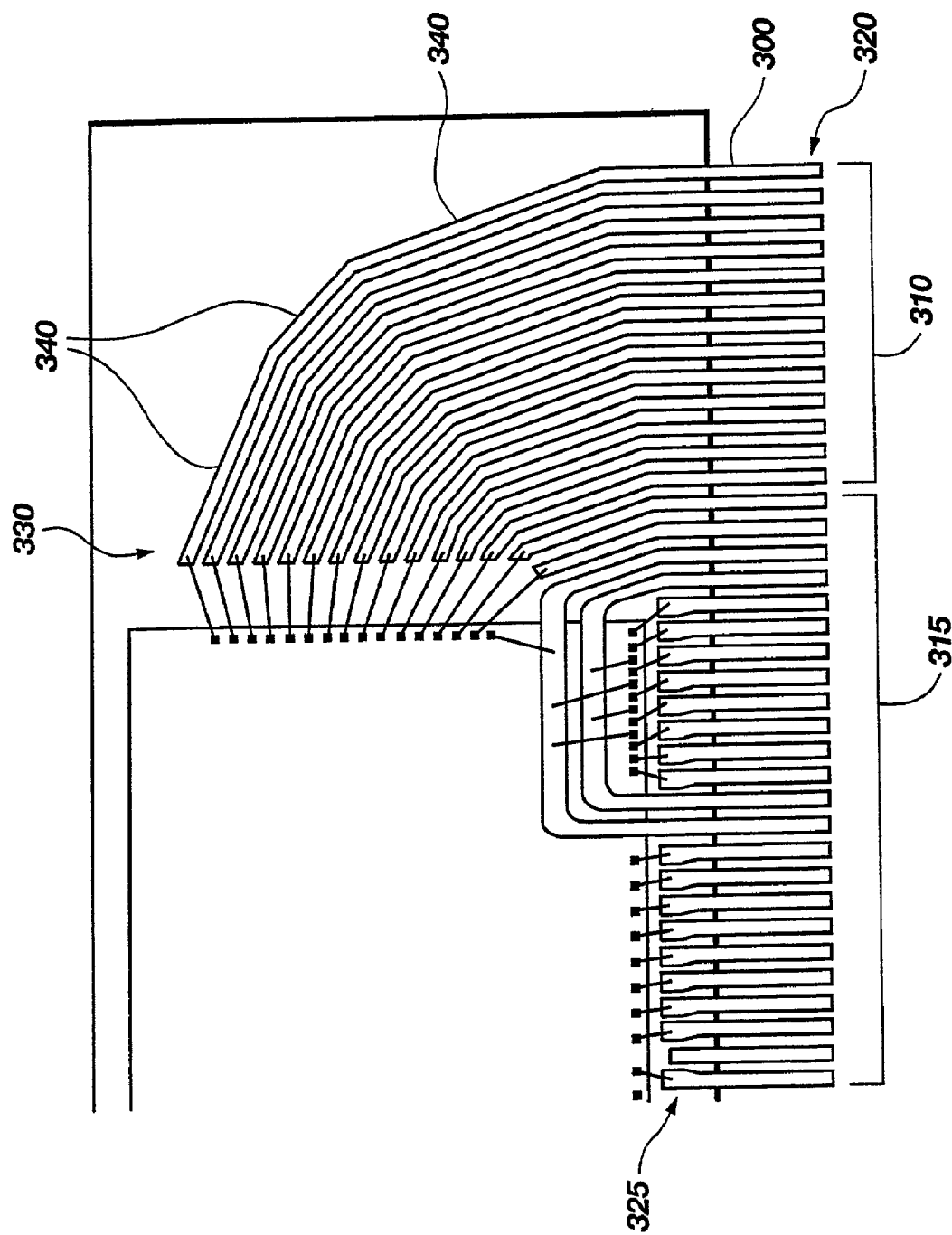
FIG. 3 is a top plan view illustrating a leadframe constructed in accordance with another embodiment of the present invention.

Another embodiment is illustrated in FIG. 3. A leadframe 300 has first and second sets of leads 310, 315. The first set of leads 310 extends from a first end 320 to a second end 330, and the second set of leads 315 extends from the first end 320 to a third end 325. In one embodiment, the first end 320 of each lead of the first set of leads 310 is substantially perpendicular to the second end 330. For both the first and second sets of leads 310, 315, the first end 320 of each lead is for electrically coupling with a printed circuit board. The second end 330 of the first set of leads 310 and the third end 325 of the second set of leads 315 are adapted for coupling with a semiconductor die, as will be discussed further below.

Figure 5:
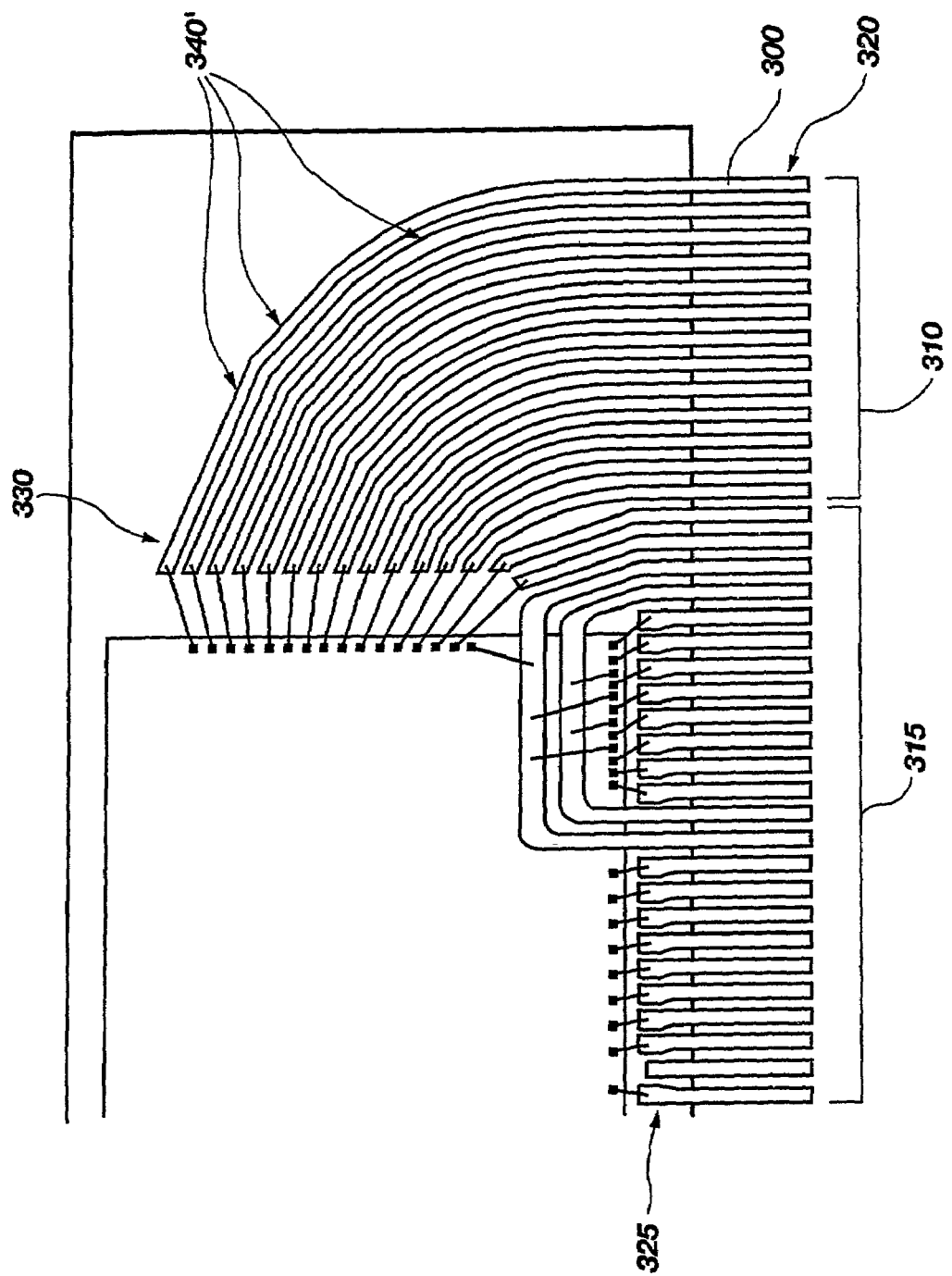
FIG. 5 is a top plan view illustrating a leadframe constructed in accordance with another embodiment of the present invention.

In one embodiment, each lead of the first set of leads 310 has at least three segments 340. The segments 340 are disposed such that a portion of each lead of the first set of leads 310 has a generally arcuate shape between the first end 320 and the second end 330. The arcuate shape of each lead of the first set of leads 310 has a different arc length than the other leads of the first set of leads 310. The segments 340 are substantially straight, and are each substantially the same length and substantially the same width. In one embodiment, at least one of the segments 340 is substantially straight and has a different length. In another embodiment, at least one of the segments 340' has an arcuate shape as shown in FIG. 5. Each lead of the second set of leads 315 extends substantially straight from the first end 320 to the third end 325. The segmented leads provide a significant advantage since they are stamped, which is easier and less expensive to manufacture.

The leadframe 200 of FIG. 2 and the leadframe 300 of FIG. 3 are formed from a single sheet of material or thin strip which is etched or stamped into a predetermined shape for connection with a selected chip design. The leads off the die are substantially flat. However, the leads or sections of the leadframe that extend over the die may need to be upset or downset, depending upon where the parting line of the mold is formed. After encapsulation in plastic, portions of the leadframe extend out of the respective chip packages. In one embodiment, the leadframe extends out of the sides of the packages at a selected elevation which is determined in advance. These outwardly extending portions include the ends of the leads of a package. These leads may be ultimately bent for insertion into a suitable connector device.

Figure 4:
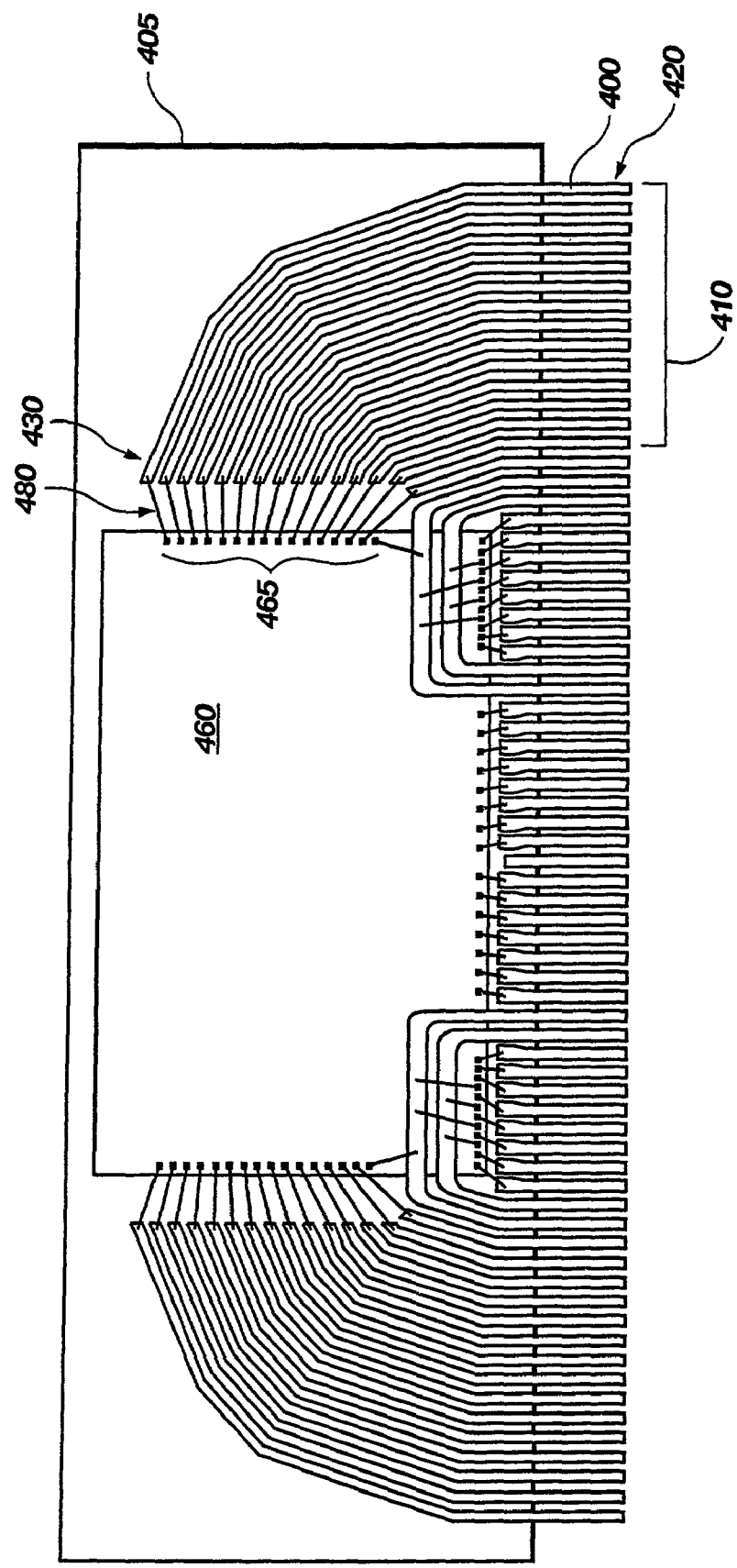
FIG. 4 is a top plan view illustrating an integrated circuit package constructed in accordance with one embodiment of the present invention.

As shown in FIG. 4, a leadframe 400 is assembled into an integrated circuit package 405. A semiconductor die 460 comprises circuitry (not shown) formed centrally on the die 460 and a plurality of bond pads 465 formed around the periphery of the die 460. The semiconductor die 460 is mounted using LOC technology with additional support from the leadframe at the edge of the die opposite the bond pad (not shown). Electrically conductive wire bonding 480 is used to connect selected bond pads 465 on the die 460 to selected leads of the leadframe 400. A portion of each lead of the first set of leads 410 of the leadframe 400 is formed in a generally arcuate shape. In one embodiment, a portion of the first set of leads 410 extends radially from a first end 420 to a second end 430. Alternatively, the first set of leads 410 includes a plurality of segments for forming the arcuate shape.

In one embodiment, the leadframe 400, semiconductor die 460 and wire bonding 480 are enclosed in protective, electrically insulative material such that ends of the leads are exposed to allow connection to be made to other electrical components. In another embodiment, leadframe 400, semiconductor die 460 and wire bonding 480 are encapsulated in plastic, thereby forming the integrated circuit package 405.

An integrated circuit package including the leadframe according to the invention has reduced effective inductance and cross-talk relative to existing integrated circuit packages. Below are simulated inductances and resistances for the tightly radiused leads of the conventional right angle leadframe shown in FIG. 1 and the leads of the arcuate leadframe shown in FIG. 2. The lead number refers to leads shown in FIGS. 1 and 2. Like numbers in the figures indicate leads connecting between same locations on the die and same exterior connections.

TABLE 1

Figure 1:
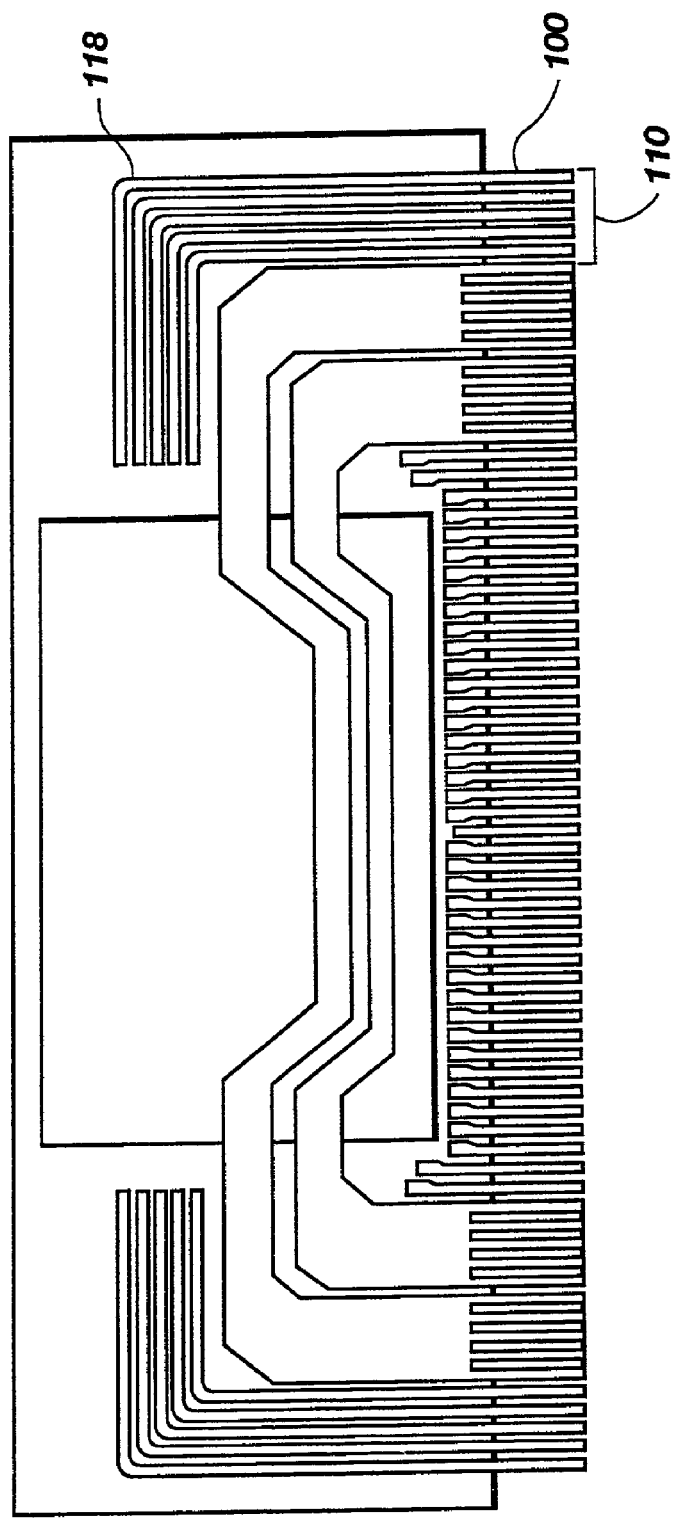
FIG. 1 is a top plan view illustrating a conventional leadframe having leads with tightly radiused corners.

| Lead No. | Prior Art Lead FIG. 1 (nH | Ohms) | Radiused Lead FIG. 2 (nH | Ohms) |
| --- | --- | --- |
| 1 | 10.30 | .514 | 9.62 | .452 |
| 2 | 9.38 | .522 | 8.85 | .466 |
| 3 | 8.71 | .506 | 8.29 | .451 |
| 4 | 8.08 | .476 | 7.83 | .432 |
| 5 | 7.32 | .423 | 7.39 | .409 |

The results in Table 1 reveal the decreased inductance for the present invention. The inductance and resistance of each lead is less for the arcuate leadframe and the segmented leadframe than in the tightly radiused leadframe. In particular, the longer leads experience the greatest improvement in using the arcuate leadframe and the segmented leadframe versus the tightly radiused leadframe.

Advantageously, the radiused leadframe provides for lower inductance, resistance, and capacitance of leads in a leadframe, as opposed to leads with tightly radiused corners. These factors are important when the leads are carrying high-frequency signals, or signals having high-frequency harmonics, such as sub-nanosecond rise times. The continuous arcuate shape of the leads and the constant width of the leads maintains line spacing between the leads. This consistency maximizes layout space of the leadframe without increasing cross-talk. In addition, a single leadframe strip or assembly can comprise leadframes for any number of a predetermined number of chips.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of fabricating an integrated circuit package, the method comprising:

providing a semiconductor die having a plurality of conductive pads;

forming a leadframe including at least two conductors, each conductor of the at least two conductors having a first end and a second end and a generally arcuate-shaped portion between the first and second ends, at least a portion of each generally arcuate-shaped portion exhibiting a constant radius;

configuring and positioning the at least two conductors such that line spacing between each of the at least two conductors is constant from their respective first ends to their respective second ends;

electrically coupling the first ends of each of the at least two conductors with at least one of the plurality of conductive pads; and encapsulating the semiconductor die and at least a portion of the at least two conductors with an insulating material.

2. The method according to claim 1, wherein forming the at least two conductors further comprises forming a first conductor to exhibit a first arc length through its generally arcuate-shaped portion and forming a second conductor to exhibit a second arc length through its generally arcuate-shaped portion wherein the first arc length is different than the second arc length.

3. The method according to claim 1, wherein forming the at least two conductors further comprises forming each generally arcuate-shaped portion of each of the at least two conductors to exhibit a different arc length than any other generally arcuate-shaped portion of any other conductor of the at least two conductors.

4. The method according to claim 1, wherein forming the at least two conductors includes forming the generally arcuate-shaped portion of at least one of the at least two conductors to include a plurality of segments including at least one straight segment and at least one generally arcuate segment.

5. The method according to claim 4, wherein the plurality of segments includes at least three segments.

6. The method according to claim 4, further comprising defining at least one segment of the plurality of segments to exhibit a different length than at least one other segment of the plurality of segments.

7. The method according to claim 1, wherein forming the at least two conductors includes forming at least one conductor of the at least two conductors such that the generally arcuate-shaped portion is a substantial portion of the at least one conductor.

8. The method according to claim 1, wherein forming the at least two conductors includes forming at least one conductor of the at least two conductors such that the generally arcuate-shaped portion exhibits a constant radius throughout an entire arc length thereof.

9. The method according to claim 1, further comprising configuring the first and second ends of each of the at least two conductors to be positioned at orientations of substantially 90° relative to each other.

10. The method according to claim 1, further comprising configuring the generally arcuate-shaped portion of each of the at least two conductors to exhibit a substantially 90° arc.

11. A method of fabricating an integrated circuit package, the method comprising:

providing a semiconductor die having a plurality of conductive pads;

forming a leadframe including at least two conductors, each conductor of the at least two conductors having a first end and a second end and a generally arcuate-shaped portion between the first and second ends, at least a portion of each generally arcuate-shaped portion exhibiting a constant radius, and forming the generally arcuate-shaped portion of at least one of the at least two conductors to include a plurality of segments including at least one straight segment and at least one generally arcuate segment;

configuring and positioning the at least two conductors such that line spacing between the generally arcuate-shaped portion of each of the at least two conductors is constant from their respective first ends to their respective second ends;

electrically coupling the first ends of each of the at least two conductors with at least one of the plurality of conductive pads; and encapsulating the semiconductor die and at least a portion of the at least two conductors with an insulating material.

12. The method according to claim 11, wherein the plurality of segments includes at least three segments.

13. The method according to claim 11, further comprising defining at least one segment of the plurality of segments to exhibit a different length than at least one other segment of the plurality of segments.

* * * * *